United States Patent
Sato et al.

(10) Patent No.: US 11,146,255 B2
(45) Date of Patent: Oct. 12, 2021

(54) POWER SUPPLY CIRCUIT AND POWER SUPPLY APPARATUS

(71) Applicant: JTEKT CORPORATION, Osaka (JP)

(72) Inventors: Fumihiko Sato, Kashiwara (JP); Shingo Suzuki, Nagoya (JP); Hiroaki Hanzawa, Toyota (JP); Masataka Okuda, Toyota (JP); Toshiyuki Mikida, Anpachi-gun (JP)

(73) Assignee: JTEKT CORPORATION, Osaka (JP)

( * ) Notice: Subject to any disclaimer, the term of this patent is extended or adjusted under 35 U.S.C. 154(b) by 0 days.

(21) Appl. No.: 16/822,359

(22) Filed: Mar. 18, 2020

(65) Prior Publication Data

US 2020/0313667 A1 Oct. 1, 2020

(30) Foreign Application Priority Data

Mar. 29, 2019 (JP) .............................. JP2019-067944

(51) Int. Cl.
*H03K 17/00* (2006.01)
*H03K 17/0812* (2006.01)
(Continued)

(52) U.S. Cl.
CPC ......... *H03K 17/08122* (2013.01); *H02P 7/28* (2013.01); *H03K 17/063* (2013.01);
(Continued)

(58) Field of Classification Search
CPC ....... H03K 17/08122; H03K 17/08104; H03K 17/162; H03K 17/063; H03K 17/168; H03K 17/687; H02P 7/28
See application file for complete search history.

(56) References Cited

U.S. PATENT DOCUMENTS 4,625,127 A * 11/1986 Lee .................. H03K 19/01806
327/297
5,296,765 A * 3/1994 Williams ............. H03K 17/164
327/108
(Continued)

FOREIGN PATENT DOCUMENTS

JP 2015-023451 A 2/2015
JP 2015-033143 A 2/2015

OTHER PUBLICATIONS

Jul. 30, 2020 Extended Search Report issued in European Patent Application No. 20165561.0.

*Primary Examiner* — Kenneth B Wells
(74) *Attorney, Agent, or Firm* — Oliff PLC (57) ABSTRACT

A power supply circuit includes a first P-channel MOSFET and a first voltage application circuit. The first P-channel MOSFET is provided between an on-board power supply and a vehicular apparatus that is a power supply target, and is configured to switch a power-ON state in which electric power is supplied to the vehicular apparatus and a power-OFF state in which the supply of the electric power is interrupted. The first voltage application circuit is configured to apply a voltage having a potential lower than a potential of the on-board power supply to a gate terminal such that a state of the first P-channel MOSFET is switched to the power-ON state, and apply a voltage having a potential equal to the potential of the on-board power supply to the gate terminal such that the state of the first P-channel MOSFET is switched to the power-OFF state.

6 Claims, 2 Drawing Sheets

(51) Int. Cl.
  *H03K 17/16*    (2006.01)
  *H03K 17/687*   (2006.01)
  *H03K 17/693*   (2006.01)
  *H02P 7/28*     (2016.01)
  *H03K 17/06*    (2006.01)
  *H03K 17/081*   (2006.01)

(52) U.S. Cl.
  CPC ..... *H03K 17/08104* (2013.01); *H03K 17/162* (2013.01); *H03K 17/168* (2013.01); *H03K 17/687* (2013.01); *H03K 2217/0081* (2013.01)

(56) References Cited

U.S. PATENT DOCUMENTS

| | | | | |
|---|---|---|---|---|
| 5,453,704 | A  * | 9/1995  | Kawashima | H03K 19/01806 326/31 |
| 6,163,199 | A  * | 12/2000 | Miske     | H03K 17/162 327/434 |
| 6,567,024 | B1 * | 5/2003  | Ishikawa  | H03K 17/6874 257/370 |
| 6,605,977 | B2 * | 8/2003  | Martini   | H03K 17/162 326/113 |
| 7,084,697 | B2 * | 8/2006  | Kawagoshi | H02M 3/073 327/536 |
| 10,250,057 | B2 * | 4/2019  | Zhao      | H02J 7/02 |
| 2010/0259233 | A1 | 10/2010 | Cheng   | |
| 2015/0022248 | A1 |  1/2015 | Fukami  | |

\* cited by examiner

POWER SUPPLY CIRCUIT AND POWER SUPPLY APPARATUS

CROSS-REFERENCE TO RELATED APPLICATION

This application claims priority to Japanese Patent Application No. 2019-067944 filed on Mar. 29, 2019, incorporated herein by reference in its entirety.

BACKGROUND

1. Technical Field

The present disclosure relates to a power supply circuit and a power supply apparatus.

2. Description of Related Art

Japanese Unexamined Patent Application Publication No. 2015-23451 (JP 2015-23451 A) describes a power supply circuit configured to switch a power-ON state and a power-OFF state between a power supply and a power supply target. In the power-ON state, electric power is supplied to the power supply target. In the power-OFF state, the electric power supply is interrupted. The power supply circuit of JP 2015-23451 A includes a voltage application circuit configured to apply voltages to an N-channel metal-oxide-semiconductor field-effect-transistor (MOSFET) and to a gate terminal of the MOSFET. In this power supply circuit, when the N-channel MOSFET is switched ON to set the power-ON state, it is necessary to apply a voltage to the gate terminal such that a source terminal connected to the power supply has a lower potential due to characteristics of the N-channel MOSFET. That is, it is necessary to apply, to the gate terminal, a voltage having a potential higher than that of the source terminal connected to the power supply. Therefore, when the N-channel MOSFET is switched ON, the voltage application circuit applies, to the gate terminal, a voltage increased to be higher than that of the power supply through driving of a charge pump.

SUMMARY

For example, when electric power of an on-board power supply is supplied to a vehicular apparatus, it is necessary that various types of information stored in the vehicular apparatus be retained in the power-ON state. If the N-channel MOSFET is employed to switch the power-ON state and the power-OFF state as in JP 2015-23451 A, it is necessary that the driving of the charge pump be kept to keep the power-ON state. If the driving of the charge pump is kept for a long period, power consumption may increase.

The present disclosure can provide a power supply circuit and a power supply apparatus in which the increase in the power consumption can be suppressed.

A power supply circuit according to a first aspect of the present disclosure includes a first P-channel MOSFET and a first voltage application circuit. The first P-channel MOSFET is provided between an on-board power supply and a vehicular apparatus that is a power supply target, and is configured to switch a power-ON state in which electric power is supplied to the vehicular apparatus and a power-OFF state in which the supply of the electric power is interrupted. A source terminal of the first P-channel MOSFET is connected to the on-board power supply, and a drain terminal of the first P-channel MOSFET is connected to the vehicular apparatus. The first voltage application circuit is configured to apply a voltage having a potential lower than a potential of the on-board power supply to a gate terminal such that a state of the first P-channel MOSFET is switched to the power-ON state, and apply a voltage having a potential equal to the potential of the on-board power supply to the gate terminal such that the state of the first P-channel MOSFET is switched to the power-OFF state.

To switch the power-ON state and the power-OFF state by using the first P-channel MOSFET as in the configuration described above, it is only necessary that the voltage having a potential lower than the potential of the on-board power supply be applied to the gate terminal. Therefore, there is no need to use a booster circuit such as a charge pump, which is necessary when an N-channel MOSFET is used. Thus, even if the voltage is kept applied to the gate terminal of the first P-channel MOSFET to keep the power-ON state, the power consumption can be reduced because of no need to use the booster circuit such as the charge pump. Even if the power-ON state is kept for a long period, the increase in the power consumption can be suppressed as compared to the case where the N-channel MOSFET is used.

In the configuration described above, the first voltage application circuit may include a switching circuit configured to switch a state in which the gate terminal and a reference potential point of the on-board power supply are connected such that the state of the first P-channel MOSFET is switched to the power-ON state, and a state in which the gate terminal and the on-board power supply are connected such that the state of the first P-channel MOSFET is switched to the power-OFF state.

According to the configuration described above, to switch the power-ON state and the power-OFF state, it is only necessary to provide the circuit configured to switch connection to a contact on the existing circuit. Therefore, there is no need to use a circuit configured to generate a dedicated voltage for switching to the respective states. Thus, complication of the voltage application circuit can be suppressed.

In the configuration described above, the power supply circuit may further include a second P-channel MOSFET and a second voltage application circuit. The second P-channel MOSFET is provided between the first P-channel MOSFET and the vehicular apparatus. A source terminal of the second P-channel MOSFET may be connected to the vehicular apparatus, and a drain terminal of the second P-channel MOSFET may be connected to the drain terminal of the first P-channel MOSFET. The second voltage application circuit may include a switching circuit configured to switch a state in which a gate terminal and the reference potential point of the on-board power supply are connected such that a state of the second P-channel MOSFET is switched to the power-ON state, and a state in which the gate terminal and the vehicular apparatus are connected such that the state of the second P-channel MOSFET is switched to the power-OFF state.

According to the configuration described above, in the power-ON state and the power-OFF state, current backflow from the power supply target to the on-board power supply can be suppressed by the second P-channel MOSFET. In the power-ON state, a voltage is applied to the gate terminal of the second P-channel MOSFET to suppress the current backflow, but similarly to the above, it is only necessary that the voltage having a potential lower than the potential of the on-board power supply be applied to the gate terminal. That is, there is no need to use the booster circuit such as the charge pump, which is necessary when the N-channel MOSFET is used. Thus, even if the voltage is kept applied to the gate terminal of the second P-channel MOSFET to suppress the current backflow in the power-ON state, the power consumption can be reduced because of no need to use the booster circuit such as the charge pump. Similarly to the above, when the power-ON state and the power-OFF state are switched for the second P-channel MOSFET, it is only necessary to switch connection to a contact on the existing circuit. Therefore, there is no need to use a circuit configured to generate a dedicated voltage for switching to the respective states. Thus, complication of the other voltage application circuit can be suppressed.

A power supply apparatus according to a second aspect of the present disclosure includes the power supply circuit described above, and a controller configured to control switching of the power-ON state and the power-OFF state. The vehicular apparatus is a steering system configured to apply power to a steering mechanism of a vehicle. The controller is configured to control the power supply circuit to keep the power-ON state irrespective of a state of a start switch of the vehicle.

According to the configuration described above, even if the power-ON state is kept for a long period, the increase in the power consumption can be suppressed as compared to the case where the N-channel MOSFET is used. Thus, it is possible to attain a power supply apparatus in which the increase in the power consumption is suppressed even if the power-ON state is kept irrespective of the state of the start switch of the vehicle.

According to the present disclosure, the increase in the power consumption can be suppressed.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
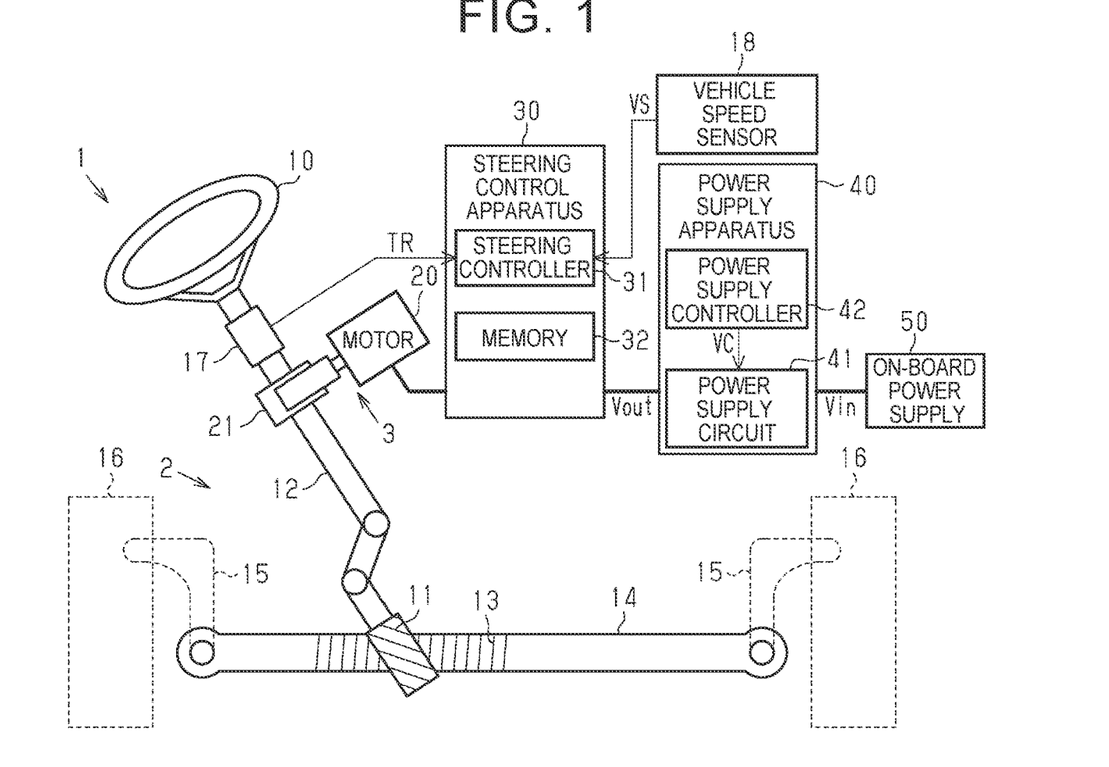
FIG. 1 is a diagram illustrating the overall structure of a steering system on which a power supply apparatus is mounted.

Description is given of an embodiment in which a power supply circuit and a power supply apparatus are applied to a steering system that is a vehicular apparatus. As illustrated in FIG. 1, a steering system 1 of this embodiment includes a steering mechanism 2 and an assist mechanism 3. The steering mechanism 2 turns steered wheels 16 based on a driver's operation of a steering wheel 10. The assist mechanism 3 includes a motor 20 configured to assist the driver's steering operation. The steering system 1 is a so-called electric power steering system configured to assist the driver's steering operation by applying a motor torque of the motor 20 to the steering mechanism 2 as a steering assist force.

The steering mechanism 2 includes a steering shaft 12 and a rack shaft 14. The steering wheel 10 is fixed to one end of the steering shaft 12, and a pinion gear 11 is provided at the other end of the steering shaft 12. The rack shaft 14 is provided with a rack gear 13 that meshes with the pinion gear 11. The pinion gear 11 and the rack gear 13 constitute a rack and pinion mechanism. Rotational motion of the steering shaft 12 is converted into reciprocating linear motion in an axial direction of the rack shaft 14 via the rack and pinion mechanism. The steering system 1 is mounted on a vehicle such that the axial direction of the rack shaft 14 is a vehicle width direction. The reciprocating linear motion of the rack shaft 14 is transmitted to the right and left steered wheels 16 via tie rods 15 coupled to respective ends of the rack shaft 14. Thus, the steered angles of the steered wheels 16 are changed, and a traveling direction of the vehicle is changed.

A torque sensor 17 is attached to the steering shaft 12 to measure a steering torque TR applied to the steering shaft 12 through an operation of the steering wheel 10. The torque sensor 17 of this embodiment detects a torsion amount of a torsion bar that constitutes the steering shaft 12, and measures the steering torque TR based on the torsion amount.

The assist mechanism 3 includes a motor 20 and a speed reducer 21 for steering assist. The motor 20 is coupled to the steering shaft 12 via the speed reducer 21. The speed reducer 21 reduces the speed of rotation of the motor 20, and transmits a rotational force obtained through the speed reduction to the steering shaft 12. A three-phase brushless motor is employed as the motor 20 of this embodiment. A worm gear mechanism is employed as the speed reducer 21 of this embodiment.

The steering system 1 includes a steering control apparatus 30 and a power supply apparatus 40. The steering control apparatus 30 includes an inverter, which is a publicly-known circuit including two switching elements in each phase of the motor 20 (U phase, V phase, and W phase). When the steering system 1 is mounted on the vehicle, the power supply apparatus 40 is connected to an on-board power supply 50, and the steering control apparatus 30 is connected to the on-board power supply 50 via the power supply apparatus 40. The power supply apparatus 40 is provided between the on-board power supply 50 and the steering control apparatus 30, which is a component of the steering system 1 that is a power supply target. The steering control apparatus 30 assists the driver's steering operation by controlling an operation of the motor 20 through electric power supply from the on-board power supply 50. The steering control apparatus 30 includes a steering controller 31 and a memory 32. The steering controller 31 executes various types of arithmetic processing for calculating, for example, a control amount for controlling the operation of the motor 20. The memory 32 stores programs and data for the various types of arithmetic processing. The torque sensor 17 and a vehicle speed sensor 18 are connected to the steering controller 31. The vehicle speed sensor 18 detects a traveling speed VS of the vehicle. To control the steering assist force, the steering controller 31 determines, based on the steering torque TR and the traveling speed VS, a steering assist force corresponding to a target steering assist force that is a target value of the steering assist force. The steering controller 31 controls the operation of the motor 20 through control of the inverter to generate the steering assist force corresponding to the target steering assist force.

Figure 2:
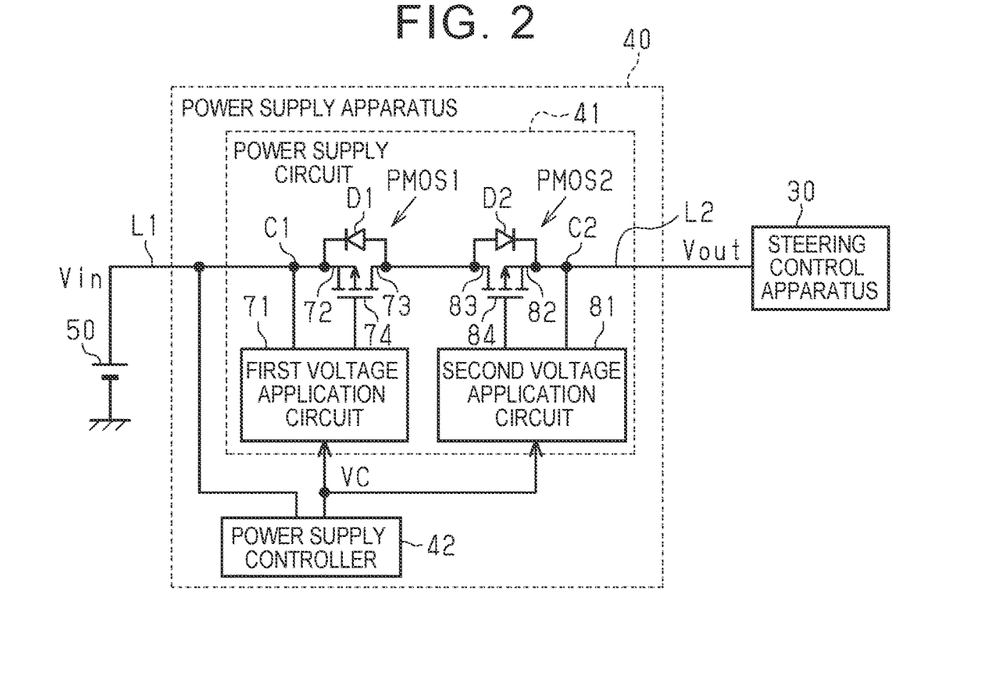
FIG. 2 is a diagram illustrating the electrical configuration of the power supply apparatus.

Next, the electrical configuration of the power supply apparatus 40 is described. As illustrated in FIG. 2, the power supply apparatus 40 includes a power supply circuit 41 and a power supply controller 42.

The power supply circuit 41 has a function of switching a power-ON state and a power-OFF state between the on-board power supply 50 and the steering control apparatus 30. In the power-ON state, electric power is supplied to the steering control apparatus 30. In the power-OFF state, the electric power supply is interrupted. A power supply voltage of the on-board power supply 50 is input to the power supply circuit 41 as an input voltage Vin. The power supply circuit 41 outputs the input voltage Vin as an output voltage Vout to be supplied to the steering control apparatus 30. In this embodiment, the power supply voltage of the on-board power supply 50, that is, the input voltage Vin is, for example, 12 volts (V). The voltage based on electric power to be supplied to the steering control apparatus 30, that is, the output voltage Vout is substantially equal to the input voltage Vin. For example, the output voltage Vout is 12 V.

The power supply controller 42 has a function of controlling the switching of the power-ON state and the power-OFF state of the power supply circuit 41. The power supply voltage of the on-board power supply 50 is input to the power supply controller 42 as the input voltage Vin. The power supply controller 42 controls the switching of the power-ON state and the power-OFF state of the power supply circuit 41 based on the input voltage Vin. In this embodiment, the power supply controller 42 is an example of a controller.

The power supply controller 42 outputs a control voltage VC to switch the power-ON state and the power-OFF state of the power supply circuit 41. Specifically, when the electric power steering system has no abnormality in its function and is normally operable to apply the steering assist force to the steering mechanism 2, the power supply controller 42 outputs a power-ON switching control voltage VC to make switching to the power-ON state such that the steering control apparatus 30 executes control on the application of the steering assist force. When the electric power steering system has an abnormality in its function and is not normally operable to apply the steering assist force to the steering mechanism 2, the power supply controller 42 outputs a power-OFF switching control voltage VC to make switching to the power-OFF state such that the steering control apparatus 30 stops the control on the application of the steering assist force. In this embodiment, the power-ON switching control voltage VC is a low-level signal having a potential lower than that of the power-OFF switching control voltage VC. That is, the power-OFF switching control voltage VC is a high-level signal having a potential higher than that of the power-ON switching control voltage VC. The power supply controller 42 determines whether an abnormality occurs in the function of the electric power steering system based on, for example, an input of an abnormality signal from the steering control apparatus 30. The abnormality signal indicates whether an abnormality occurs in the function of the electric power steering system.

In this embodiment, when the electric power steering system has no abnormality in its function and is normally operable to apply the steering assist force to the steering mechanism 2, the power supply controller 42 outputs the power-ON switching control voltage VC irrespective of whether ignition is ON or OFF as a state of a start switch of the vehicle. That is, the on-board power supply 50 keeps supplying electric power to the steering control apparatus 30, that is, the memory 32 when the ignition is not only ON but also OFF. Thus, when the ignition is not only ON but also OFF, the memory 32 can retain various types of information stored for the various types of arithmetic processing to be executed by the steering controller 31.

The configuration of the power supply circuit 41 is described in detail. As illustrated in FIG. 2, the power supply circuit 41 includes a first P-channel MOSFET (PMOS 1), a second P-channel MOSFET (PMOS 2) different from the PMOS 1, a first voltage application circuit 71, and a second voltage application circuit 81 different from the first voltage application circuit 71. The first voltage application circuit 71 has a function of switching switch states of the PMOS 1. The second voltage application circuit 81 has a function of switching switch states of the PMOS 2. The PMOS 1 and the PMOS 2 of this embodiment are P-channel MOSFETs having source terminals 72 and 82 associated with P-type semiconductor layers, drain terminals 73 and 83 associated with P-type semiconductor layers, and gate terminals 74 and 84 associated with N-type semiconductor layers, respectively.

Figure 3:
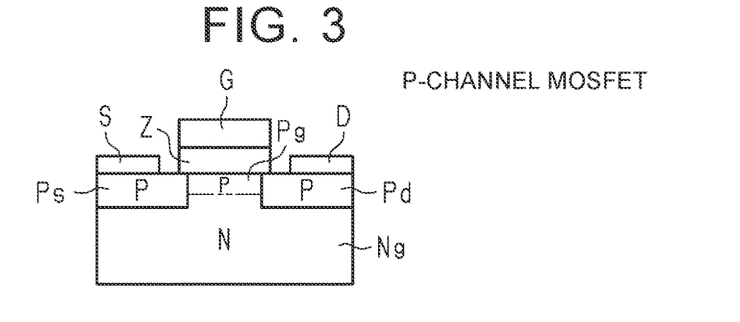
FIG. 3 is a diagram illustrating the overall structure of a P-channel MOSFET.

As illustrated in FIG. 3, the P-channel MOSFET has the following characteristics. When a potential of a gate terminal G is lower than a potential of a source terminal S and a potential difference between those terminals is equal to or larger than a preset threshold such as 2 V, the P-channel MOSFET is turned ON such that a current is conductive between the source terminal S and a drain terminal D. This is because the potential difference between the source terminal S and the gate terminal G is larger than the threshold and holes are gathered near the surface of an N-type semiconductor layer Ng (represented by "N" in FIG. 3) on an insulating layer Z side to provide a P-type semiconductor layer Pg (represented by "P" in FIG. 3) serving as an inversion layer. In this case, a P-type semiconductor layer Ps (represented by "P" in FIG. 3) associated with the source terminal S and a P-type semiconductor layer Pd (represented by "P" in FIG. 3) associated with the drain terminal D are electrically connected through the P-type semiconductor layer Pg. Thus, a current is conductive between the source terminal S and the drain terminal D.

Further, the P-channel MOSFET has the following characteristics. When the potential of the source terminal S is closer to the potential of the gate terminal G and the potential difference between those terminals is smaller than the threshold, the P-channel MOSFET is turned OFF such that no current is conductive between the source terminal S and the drain terminal D. This is because the potential difference between the source terminal S and the gate terminal G is smaller than the threshold and the N-type semiconductor layer Ng associated with the gate terminal G electrically interrupts the P-type semiconductor layer Ps associated with the source terminal S and the P-type semiconductor layer Pd associated with the drain terminal D such that no current is conductive between the source terminal S and the drain terminal D.

Returning to the description with reference to FIG. 2, the source terminal 72 of the PMOS 1 is connected to a high-potential side of the on-board power supply 50, and the drain terminal 73 of the PMOS 1 is connected to the steering control apparatus 30 via the PMOS 2. The gate terminal 74 of the PMOS 1 is connected to the first voltage application circuit 71. A contact C1 on a connection line L1 connecting the PMOS 1 and the high-potential side of the on-board power supply 50 is connected to the first voltage application circuit 71.

The drain terminal 83 of the PMOS 2 is connected to the drain terminal 73 of the PMOS 1, and the source terminal 82 of the PMOS 2 is connected to the steering control apparatus 30. The gate terminal 84 of the PMOS 2 is connected to the second voltage application circuit 81. A contact C2 on a connection line L2 connecting the PMOS 2 and the steering control apparatus 30 is connected to the second voltage application circuit 81.

In this embodiment, the PMOS 1 and the PMOS 2 are connected in series by connecting their drain terminals 73 and 83 such that electric power can be supplied from the on-board power supply 50 to the steering control apparatus 30. In this case, directions of a parasitic diode D1 provided in the PMOS 1 and a parasitic diode D2 provided in the PMOS 2 are opposite to each other such that current flows are blocked from the source terminals 72 and 82 to the drain terminals 73 and 83, respectively.

Figure 4:
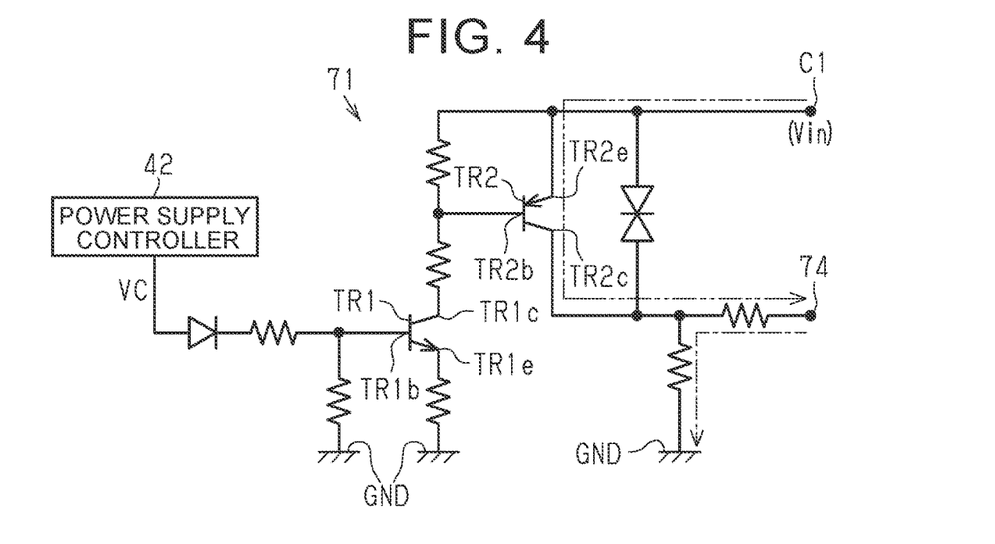
FIG. 4 is a circuit diagram illustrating the circuit structure of a first voltage application circuit of a power supply circuit of the power supply apparatus.

Next, the structures of the first voltage application circuit 71 and the second voltage application circuit 81 are described in more detail. As illustrated in FIG. 4, the first voltage application circuit 71 includes a switching circuit constituted by a combination of a transistor TR1 that is an NPN bipolar transistor and a transistor TR2 that is a PNP bipolar transistor.

In the transistor TR1, a base terminal TR1$b$ is connected to the power supply controller 42 such that the control voltage VC output from the power supply controller 42 is divided through a voltage division resistor and a current based on the divided voltage flows into the base terminal TR1$b$. In the transistor TR1, an emitter terminal TR1$e$ is connected to a reference potential point GND, and a collector terminal TR1$c$ is connected to a base terminal TR2$b$ of the transistor TR2 and the contact C1. That is, the transistor TR1 is connected to the on-board power supply 50 via the collector terminal TR1$c$ and the contact C1.

When a potential difference between the base terminal TR1$b$ and the emitter terminal TR1$e$ is equal to or larger than a preset threshold such as 0.5 V, the transistor TR1 is turned ON such that a current is conductive between the collector terminal TR1$c$ and the emitter terminal TR1$e$. In this case, a current based on electric power supply from the on-board power supply 50, that is, a current based on the input voltage Vin of the power supply circuit 41 flows between the collector terminal TR1$c$ and the emitter terminal TR1$e$.

When the potential difference between the base terminal TR1$b$ and the emitter terminal TR1$e$ is smaller than the threshold set in the transistor TR1, the transistor TR1 is turned OFF such that no current is conductive between the collector terminal TR1$c$ and the emitter terminal TR1$e$. In this case, the current based on the electric power supply from the on-board power supply 50, that is, the current based on the input voltage Vin of the power supply circuit 41, does not flow between the collector terminal TR1$c$ and the emitter terminal TR1$e$.

In this embodiment, the power-OFF switching voltage that is the high-level signal output from the power supply controller 42 is set to a value equal to or larger than the threshold set in the transistor TR1, but the power-ON switching voltage that is the low-level signal output from the power supply controller 42 is set to a value smaller than the threshold set in the transistor TR1.

In the transistor TR2, the base terminal TR2$b$ is connected to the on-board power supply 50 such that, when the transistor TR1 is ON, a current based on a voltage obtained by dividing the input voltage Vin by a voltage division resistor flows into the base terminal TR2$b$. The transistor TR2 is connected such that, when the transistor TR1 is OFF, a current based on the input voltage Vin flows into the base terminal TR2$b$. In the transistor TR2, an emitter terminal TR2$e$ is connected to the contact C1, and a collector terminal TR2$c$ is connected to the reference potential point GND and the gate terminal 74 of the PMOS 1 via voltage division resistors. That is, the transistor TR2 is connected to the on-board power supply 50 via the emitter terminal TR2$e$ and the contact C1, and is connected to the PMOS 1 the collector terminal TR2$c$ and the gate terminal 74.

The transistor TR2 is configured such that, when the transistor TR1 is ON, a potential difference between the base terminal TR2$b$ and the collector terminal TR2$c$ is equal to or larger than a preset threshold such as 0.5 V, and the transistor TR2 is turned ON such that a current is conductive between the collector terminal TR2$c$ and the emitter terminal TR2$e$. In this case, the current based on the electric power supply from the on-board power supply 50, that is, the current based on the input voltage Vin of the power supply circuit 41 flows between the collector terminal TR2$c$ and the emitter terminal TR2$e$. Thus, the high-potential side of the on-board power supply 50 and the gate terminal 74 of the PMOS 1 are connected via the first voltage application circuit 71.

The transistor TR2 is configured such that, when the transistor TR1 is OFF, the potential difference between the base terminal TR2$b$ and the collector terminal TR2$c$ is not equal to or larger than the threshold set in the transistor TR2, and the transistor TR2 is turned OFF such that no current is conductive between the collector terminal TR2$c$ and the emitter terminal TR2$e$. In this case, the current based on the electric power supply from the on-board power supply 50, that is, the current based on the input voltage Vin of the power supply circuit 41 does not flow between the collector terminal TR2$c$ and the emitter terminal TR2$e$. Thus, the reference potential point GND and the gate terminal 74 of the PMOS 1 are connected via the first voltage application circuit 71.

Figure 5:
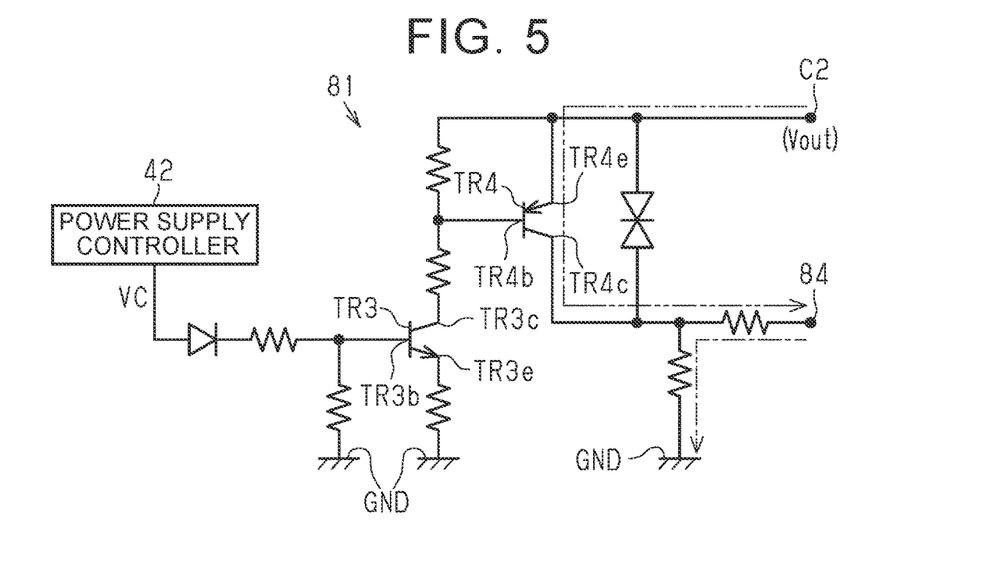
FIG. 5 is a circuit diagram illustrating the circuit structure of a second voltage application circuit of the power supply circuit of the power supply apparatus.

As illustrated in FIG. 5, the second voltage application circuit 81 includes a switching circuit constituted by a combination of a transistor TR3 that is an NPN bipolar transistor and a transistor TR4 that is a PNP bipolar transistor.

The transistor TR3 has the same structure as that of the transistor TR1 of the first voltage application circuit 71, but differs from the transistor TR1 in that a collector terminal TR3$c$ is connected to the contact C2. That is, the transistor TR3 is connected to the steering control apparatus 30 via the collector terminal TR3$c$ and the contact C2. When the transistor TR3 is turned ON such that a current is conductive between the collector terminal TR3$c$ and an emitter terminal TR3$e$, a current based on the electric power supply from the on-board power supply 50 to the steering control apparatus 30, that is, a current based on the output voltage Vout of the power supply circuit 41 flows between the collector terminal TR3$c$ and the emitter terminal TR3$e$. When the transistor TR3 is turned OFF such that no current is conductive between the collector terminal TR3$c$ and the emitter terminal TR3$e$, the current based on the output voltage Vout of the power supply circuit 41 does not flow between the collector terminal TR3$c$ and the emitter terminal TR3$e$.

The transistor TR4 has the same structure as that of the transistor TR2 of the first voltage application circuit 71, but differs from the transistor TR2 in that an emitter terminal TR4$e$ is connected to the contact C2. That is, the transistor TR4 is connected to the steering control apparatus 30 via the emitter terminal TR4$e$ and the contact C2.

When the transistor TR4 is turned ON such that a current is conductive between a collector terminal TR4$c$ and the emitter terminal TR4$e$, the current based on the output voltage Vout of the power supply circuit 41 flows between the collector terminal TR4$c$ and the emitter terminal TR4$e$. Thus, a high-potential side of the steering control apparatus 30 and the gate terminal 84 of the PMOS 2 are connected via the second voltage application circuit 81.

When the transistor TR4 is turned OFF such that no current is conductive between the collector terminal TR4c and the emitter terminal TR4e, the current based on the output voltage Vout of the power supply circuit 41 does not flow between the collector terminal TR4c and the emitter terminal TR4e. Thus, the reference potential point GND and the gate terminal 84 of the PMOS 2 are connected via the second voltage application circuit 81.

Next, description is given of an operation of the power supply circuit 41 when the power-ON state and the power-OFF state for the steering control apparatus 30 are switched. As illustrated in FIG. 4, when the control voltage VC is input from the power supply controller 42 to the first voltage application circuit 71 as the low-level signal, the transistor TR1 is turned OFF. When the transistor TR1 is OFF, the transistor TR2 is turned OFF. Therefore, the gate terminal 74 and the reference potential point GND are connected as indicated by an arrow of a long dashed short dashed line in FIG. 4. Thus, the potential of the gate terminal 74 is switched to a potential of the reference potential point GND. In this case, the potential of the gate terminal 74 is lower than a potential of the source terminal 72, and a potential difference between those terminals is 12 V that is equal to or larger than the threshold set in the PMOS 1. Thus, the PMOS 1 is turned ON.

As illustrated in FIG. 5, when the control voltage VC is input from the power supply controller 42 to the second voltage application circuit 81 as the low-level signal, the transistor TR3 is turned OFF. When the transistor TR3 is OFF, the transistor TR4 is turned OFF. Therefore, the gate terminal 84 and the reference potential point GND are connected as indicated by an arrow of a long dashed short dashed line in FIG. 5. Thus, the potential of the gate terminal 84 is switched to the potential of the reference potential point GND. In this case, the potential of the gate terminal 84 is lower than a potential of the source terminal 82, and a potential difference between those terminals is 12 V that is equal to or larger than the threshold set in the PMOS 2. Thus, the PMOS 2 is turned ON.

As described above, the power supply controller 42 switches the state of the power supply circuit 41 to the power-ON state by outputting the low-level signals to the first voltage application circuit 71 and the second voltage application circuit 81 and switching ON the PMOS 1 and the PMOS 2.

As illustrated in FIG. 4, when the control voltage VC is input from the power supply controller 42 to the first voltage application circuit 71 as the high-level signal, the transistor TR1 is turned ON. When the transistor TR1 is ON, the transistor TR2 is turned ON. Therefore, the contact C1 and the gate terminal 74 are connected via the transistor TR2 as indicated by an arrow of a long dashed double-short dashed line in FIG. 4. Thus, the potential of the gate terminal 74 is switched to a potential of the contact C1. In this case, the potential of the source terminal 72 is equal to the potential of the gate terminal 74, and the potential difference between those terminals is 0 V that is smaller than the threshold set in the PMOS 1. Thus, the PMOS 1 is turned OFF.

As illustrated in FIG. 5, when the control voltage VC is input from the power supply controller 42 to the second voltage application circuit 81 as the high-level signal, the transistor TR3 is turned ON. When the transistor TR3 is ON, the transistor TR4 is turned ON. Therefore, the contact C2 and the gate terminal 84 are connected via the transistor TR4 as indicated by an arrow of a long dashed double-short dashed line in FIG. 5. Thus, the potential of the gate terminal 84 is switched to a potential of the contact C2. In this case, the potential of the source terminal 82 is equal to the potential of the gate terminal 84, and the potential difference between those terminals is 0 V that is smaller than the threshold set in the PMOS 2. Thus, the PMOS 2 is turned OFF.

As described above, the power supply controller 42 switches the state of the power supply circuit 41 to the power-OFF state by outputting the high-level signals to the first voltage application circuit 71 and the second voltage application circuit 81 and switching OFF the PMOS 1 and the PMOS 2.

Effects of this embodiment are described below. (1) To switch the power-ON state and the power-OFF state of the power supply circuit 41 of this embodiment by using the PMOS 1 and the PMOS 2, it is only necessary that voltages having potentials lower than that of the on-board power supply 50 be applied to the gate terminals 74 and 84. Therefore, there is no need to use a booster circuit such as a charge pump, which is necessary when N-channel MOSFETs are used. Thus, even if the voltages are kept applied to the gate terminals 74 and 84 of the PMOS 1 and the PMOS 2 to keep the power-ON state, power consumption can be reduced because of no need to use the booster circuit such as the charge pump. Even if the power-ON state is kept for a long period, an increase in the power consumption can be suppressed as compared to the case where the N-channel MOSFETs are used.

(2) To switch the power-ON state and the power-OFF state, the power supply circuit 41 of this embodiment only needs to have the circuits configured to switch connection to the reference potential point GND and connection to the contacts C1 and C2 on the existing circuits. Therefore, there is no need to use circuits configured to generate dedicated voltages for switching to the respective states. Thus, complication of the voltage application circuits 71 and 81 can be suppressed.

(3) In the power-ON state and the power-OFF state of the power supply circuit 41 of this embodiment, current backflow from the power supply target to the on-board power supply 50 can be suppressed by the PMOS 2 different from the PMOS 1. In the power-ON state, a voltage is applied to the gate terminal 84 of the PMOS 2 to suppress the current backflow, but similarly to the above, it is only necessary that a voltage having a potential lower than that of the on-board power supply 50 be applied to the gate terminal 84. That is, there is no need to use the booster circuit such as the charge pump, which is necessary in the case of N-channel MOSFETs. Thus, even if the voltage is kept applied to the gate terminal 84 of the PMOS 2 to suppress the current backflow in the power-ON state, the power consumption can be reduced because of no need to use the booster circuit such as the charge pump. Similarly to the above, when the power-ON state and the power-OFF state are switched for the PMOS 2, it is only necessary to provide the circuit configured to switch connection to the reference potential point GND and connection to the contact C2 on the existing circuit. Therefore, there is no need to use the circuit configured to generate a dedicated voltage for switching to the respective states. Thus, the complication of the second voltage application circuit 81 can be suppressed.

(4) In the power supply apparatus 40 of this embodiment, even if the power-ON state is kept for a long period, the increase in the power consumption can be suppressed as compared to the case where the N-channel MOSFETs are used. Thus, it is possible to attain a power supply apparatus 40 in which the increase in the power consumption is suppressed even if the power-ON state is kept irrespective of the state of the start switch of the vehicle.

The embodiment described above may be modified as follows. The following other embodiments may be combined without causing any technical contradiction. The PMOS 2 is provided to suppress the current backflow from the power supply target to the on-board power supply 50, but the PMOS 2 need not be provided. In this case, there is no need to provide even the second voltage application circuit 81 configured to switch ON and OFF of the PMOS 2.

When the PMOS 1 is switched ON, the potential of the gate terminal 74 of the PMOS 1 is equal to the potential of the reference potential point GND, but it is only necessary to apply a voltage to the gate terminal 74 of the PMOS 1 such that the potential difference between the gate terminal 74 and the source terminal 72 of the PMOS 1 is equal to or larger than the threshold. The same applies to the PMOS 2.

When the PMOS 1 is switched OFF, the potential of the gate terminal 74 of the PMOS 1 is the potential of the on-board power supply 50, but it is only necessary to apply a voltage to the gate terminal 74 of the PMOS 1 such that the potential difference between the gate terminal 74 and the source terminal 72 of the PMOS 1 is smaller than the threshold. The same applies to the PMOS 2.

The electric power supply to the inverter of the steering control apparatus 30 may be configured to be interrupted after the start switch is turned OFF until the start switch is turned ON next time.

In the embodiment described above, the steering system 1 to which the power supply apparatus 40 is applied is the electric power steering system in which the motor 20 is coupled to the steering shaft 12 via the speed reducer 21, but may be an electric power steering system in which the motor 20 is coupled to the rack shaft 14 via the speed reducer 21. Further, the steering system 1 is not limited to the electric power steering system to which the power supply apparatus 40 is applied. For example, the power supply apparatus 40 may be applied to a steer-by-wire type steering system.

The power supply target of the power supply apparatus 40 may be other vehicular apparatuses such as an air bag apparatus. For example, the vehicular apparatus that is the power supply target of the power supply apparatus 40 may be an unmanned transport vehicle.

What is claimed is:

1. A power supply circuit comprising:
a first P-channel MOSFET provided between an on-board power supply and a vehicular apparatus that is a power supply target, and configured to switch between a power-ON state in which electric power is supplied to the vehicular apparatus and a power-OFF state in which the supply of the electric power is interrupted;
a first voltage application circuit;
a first contact on a first connection line connecting the first P-channel MOSFET and the on-board power supply, the first contact being connected to the first voltage application circuit, and the first voltage application circuit being connected between the first contact and the first P-channel MOSFET, wherein
a source terminal of the first P-channel MOSFET is connected to the first contact and the on-board power supply, and
the first voltage application circuit is configured to:
apply a voltage having a potential lower than a potential of the on-board power supply to a gate terminal of the first P-channel MOSFET such that a state of the first P-channel MOSFET is switched to the power-ON state; and
apply a voltage having a potential equal to the potential of the on-board power supply to the gate terminal of the first P-channel MOSFET such that the state of the first P-channel MOSFET is switched to the power-OFF state;
a second P-channel MOSFET provided between the first P-channel MOSFET and the vehicular apparatus, wherein
the first P-channel MOSFET and the second P-channel MOSFET are connected in series by connecting a drain terminal of the first P-channel MOSFET to a drain terminal of the second P-channel MOSFET,
a source terminal of the second P-channel MOSFET is connected to the vehicular apparatus,
the first voltage application circuit comprises a switching circuit,
the switching circuit of the first voltage application circuit comprises:
a first NPN bipolar transistor; and
a first PNP bipolar transistor;
the first NPN bipolar transistor is connected to the on-board power supply via a collector terminal of the first NPN bipolar transistor and the first contact, and
the first PNP bipolar transistor is connected to the on-board power supply via an emitter terminal of the first PNP bipolar transistor and the first contact, and is connected to the first P-channel MOSFET via a collector terminal of the first PNP bipolar transistor and the gate terminal of the first P-channel MOSFET.

2. The power supply circuit according to claim 1, wherein the first voltage application circuit includes a switching circuit configured to switch between a first state in which the gate terminal of the first P-channel MOSFET and a reference potential point of the on-board power supply are connected together such that the state of the first P-channel MOSFET is switched to the power-ON state, and a second state in which the gate terminal of the first P-channel MOSFET and the on-board power supply are connected such that the state of the first P-channel MOSFET is switched to the power-OFF state.

3. The power supply circuit according to claim 2, further comprising:
a second voltage application circuit;
a second contact on a second connection line connecting the second P-channel MOSFET and a steering control apparatus, the second contact being connected to the second voltage application circuit, and the second voltage application circuit being connected between the second contact and the second P-channel MOSFET, wherein
the second voltage application circuit includes a switching circuit configured to switch between a first state in which a gate terminal of the second P-channel MOSFET and the reference potential point of the on-board power supply are connected such that a state of the second P-channel MOSFET is switched to the power-ON state, and a second state in which the gate terminal of the second P-channel MOSFET and the vehicular apparatus are connected together such that the state of the second P-channel MOSFET is switched to the power-OFF state.

4. A power supply apparatus comprising:
the power supply circuit according to claim 1; and a controller configured to control switching of the power-ON state and the power-OFF state, wherein
the vehicular apparatus is a steering system configured to apply power to a steering mechanism of a vehicle, and
the controller is configured to control the power supply circuit to keep the power-ON state irrespective of a state of a start switch of the vehicle.

5. The power supply circuit according to claim 1, further comprising:
a second voltage application circuit; and
a second contact on a second connection line connecting the second P-channel MOSFET and a steering control apparatus, the second contact being connected to the second voltage application circuit, and the second voltage application circuit being connected between the second contact and the second P-channel MOSFET, wherein
the second voltage application circuit comprises a switching circuit,
the switching circuit of the second voltage application circuit comprises:
a second NPN bipolar transistor; and
a second PNP bipolar transistor;
the second NPN bipolar transistor is connected to the steering control apparatus via a collector terminal of the second NPN bipolar transistor and the second contact, and
the second PNP bipolar transistor is connected to the steering control apparatus via an emitter terminal of the second PNP bipolar transistor and the second contact, and is connected to the second P-channel MOSFET via a collector terminal of the second PNP bipolar transistor and a gate terminal of the second P-channel MOSFET.

6. The power supply circuit according to claim 1, wherein the power supply circuit does not include an N-channel MOSFET.

* * * * *